(12) United States Patent
Sarkas et al.

(10) Patent No.: US 7,517,513 B2
(45) Date of Patent: Apr. 14, 2009

(54) PROCESS FOR PREPARING NANOSTRUCTURED CERIUM OXIDE MATERIALS OF CONTROLLED SURFACE CHEMISTRY OF ZETA POTENTIAL

(75) Inventors: Harry W. Sarkas, Plainfield, IL (US); Jonathan Piepenbrink, Crete, IL (US)

(73) Assignee: Nanophase Technologies Corporation, Romeoville, IL (US)

( * ) Notice: Subject to any disclaimer, the term of this patent is extended or adjusted under 35 U.S.C. 154(b) by 448 days.

(21) Appl. No.: 10/452,736

(22) Filed: Jun. 2, 2003

(65) Prior Publication Data

US 2003/0230479 A1 Dec. 18, 2003

Related U.S. Application Data

(62) Division of application No. 10/172,848, filed on Jun. 17, 2002, now Pat. No. 6,669,823.

(51) Int. Cl.
*C01F 17/00* (2006.01)
(52) U.S. Cl. .................................. 423/263; 977/811
(58) Field of Classification Search .............. 423/263; 977/811
See application file for complete search history.

(56) References Cited

U.S. PATENT DOCUMENTS

| 3,209,193 | A | | 9/1965 | Sheer et al. |
| 4,642,207 | A | | 2/1987 | Uda et al. |
| 5,460,701 | A | | 10/1995 | Parker et al. |
| 5,705,222 | A | * | 1/1998 | Somasundaran et al. ..... 427/220 |
| 5,770,022 | A | | 6/1998 | Chang et al. |
| 5,891,205 | A | * | 4/1999 | Picardi et al. .................. 51/308 |
| 6,245,280 | B1 | | 6/2001 | Tan et al. |
| 6,811,758 | B1 | * | 11/2004 | Pickering et al. ........... 423/21.1 |
| 7,052,777 | B2 | * | 5/2006 | Brotzman et al. ........... 428/570 |
| 7,141,227 | B2 | * | 11/2006 | Chan ........................... 423/263 |

FOREIGN PATENT DOCUMENTS

| DE | 19804838 A1 | 8/1999 |
| EP | 1336668 A1 | 8/2003 |
| WO | 03085693 A1 | 10/2003 |

OTHER PUBLICATIONS

Robert C. Weast, Editor-in-Chief, CRC Handbook of Chemistry and Physics (CRC Press, Inc. 1985), p. F-156 (Components of Atmospheric Air).

* cited by examiner

*Primary Examiner*—Steven Bos
(74) *Attorney, Agent, or Firm*—Wildman, Harrold, Allen & Dixon LLP

(57) ABSTRACT

A process to prepare stoichiometric-nanostructured materials comprising generating a plasma, forming an "active volume" through introduction of an oxidizing gas into the plasma, before the plasma is expanded into a field-free zone, either (1) in a region in close proximity to a zone of charge carrier generation, or (2) in a region of current conduction between field generating elements, including the surface of the field generation elements, and transferring energy from the plasma to a precursor material to form in the "active volume" at least one stoichiometric-nanostructured material and a vapor that may be condensed to form a stoichiometric-nanostructured material. The surface chemistry of the resulting nanostructured materials is substantially enhanced to yield dispersion stable materials with large zeta-potentials.

9 Claims, No Drawings

US 7,517,513 B2

PROCESS FOR PREPARING NANOSTRUCTURED CERIUM OXIDE MATERIALS OF CONTROLLED SURFACE CHEMISTRY OF ZETA POTENTIAL

CROSS REFERENCE TO RELATED APPLICATION

This application is a Divisional of U.S. patent application Ser. No. 10/172,848 entitled "PROCESS FOR PREPARING NANOSTRUCTURED MATERIALS OF CONTROLLED SURFACE CHEMISTRY", filed on Jun. 17, 2002 now U.S. Pat. No. 6,669,823.

THE FIELD OF THE INVENTION

The present invention is concerned generally with making nanostructured materials using plasma technologies. More particularly, the invention is concerned with a method of making a variety of stoichiometric-nanostructured materials by forming a unique "active volume" in a plasma through the introduction of an oxidizing gas. The surface chemistry of the resulting nanostructured material is substantially enhanced to yield dispersion stable materials with large zeta-potentials.

BACKGROUND OF THE INVENTION

Methods of plasma formation are previously known in the art and may be selected from a group of comprising radio-frequency fields, microwave discharges, free-burning electric arcs, transferred electric arcs, high-intensity lasers, capacitively coupled electro-thermal igniters, DC glow discharges, and DC cold cathode discharges.

Methods for transferring energy to a precursor material by exposing a precursor material to the energy of a plasma are previously known in the art. Precursor material may be introduced into a plasma at any point. For example, a plasma may be created by a high intensity electric arc and a precursor may be introduced at any point of the arc column. In U.S. Pat. No. 3,209,193, the precursor material is introduced into the arc column of a free-burning plasma at the anode and U.S. Pat. No. 3,900,762 describes a working embodiment of the volumetric introduction of precursor into a plasma arc.

The precursor material may also be a consumable electrode. For example, in U.S. Pat. Nos. 5,460,701 and 5,514,349, a transferred electric arc between a cathode and a consumable anode is used to generate precursors in an elongated ionized arc that extends beyond the conduction columns.

Prior art teaches that materials formed by plasma techniques may have unusual properties. But prior art does not teach the synthesis of stoichiometric-nanostructured materials with controlled surface chemistry.

Materials produced by the method of this patent have surface chemistry characterized by a high aqueous dispersion stability, a low rate of hydrolysis, and a large zeta-potential. Materials produced by the method of this patent are stoichiometricly-nanostructured by the "active volume". The "active volume" is in a plasma and is created by introducing an oxidizing gas into the plasma, before the plasma is expanded into a field-free zone, either (1) in a region in close proximity to a zone of charge carrier generation, or (2) in a region of current conduction between field generating elements, including the surface of the field generating elements. Energy is transferred from the plasma to a precursor material and at least one of a stoichiometric-nanostructured material and a vapor that may be condensed to form a stoichiometric-nanostructured material are formed in the "active volume". The "active volume" is the most reactive part of the plasma and material synthesized in the "active volume" are stoichiometric-nanostructures with unique surface chemistry.

Stoichiometric-nanostructures or stoichiometriclly-nanostructured materials are defined as materials having controlled chemistry at the nanoscale. The chemistry of the nanostructured material may be controlled to be of full or partial stoichiometry, in the chemical sense, with respect to a reactant.

Prior art does not teach the introduction of oxidizing gas in a plasma to nanostructure materials to have unique surface chemistry. Instead prior art teaches away from the use of oxidizing gases in a plasma. For example U.S. Pat. No. 3,899,573 teaches the use of a reducing gas in the plasma created by a free-burning arc. The use of oxidizing plasma environments is conventionally discouraged because the materials used to generate the plasma are aggressively corroded. For example U.S. Pat. No. 4,642,207 discloses the use of an oxidizing plasma. But this process cannot be practiced in a manufacturing environment because aggressive corrosion rapidly renders process equipment inoperable. This is often the case even under conditions where shielding gas flows are used to protect specific process equipment as disclosed in prior art. The present invention teaches that judicious formation of an "active volume" enables the use of an oxidizing environment within the conduction column of a variety of plasmas to synthesize stoichiometric-nanostructured materials with unique surface chemistry.

Prior art does not teach the importance of forming at least one of stoichiometric-nanostructured material or vapor that may be condensed to form stoichiometric-nanostructured material in the "active volume" of a plasma. Instead prior art transfers energy from a plasma to precursors and forms nano-particles by injecting at least one of a quench and a reaction gas:

after the plasma is expanded into a field-free zone; and/or
down stream from either (1) a zone of charge carrier generation, or (2) a region of current conduction between field generating elements.

U.S. Pat. Nos. 5,460,701 and 5,514,349, use a transferred electric arc between a cathode and a consumable anode to generate an elongated ionized arc that extends beyond the conduction columns and injects at least one of a quench and a reaction gas into the elongated ionized arc. Other forms of the art introduce a reactive gas down stream from the "active volume" and form materials during thermal quench or gas phase nucleation. In all cases the art teaches the formation of materials in less reactive plasmas.

Experiments in our laboratory indicate the "active volume" must be carefully controlled, to form before the plasma is expanded into a field-free zone, either (1) in a region in close proximity to a zone of charge carrier generation, or (2) in a region of current conduction between field generating elements, including the surface of the field generating elements, to derive the benefits of the reactive plasma and synthesize a stoichiometricly-nanostructured material with unique surface chemistry.

OBJECTS OF THE INVENTION

An object of the present invention is the development of a process for producing stoichiometric-nanostructured materials. This process comprises the steps of:
generating a plasma;
forming an "active volume" through introduction of an oxidizing gas into the plasma, before the plasma is expanded into a field-free zone, either (1) in a region in close proximity to a zone of charge carrier generation, or (2) in a region of current conduction between field generating elements, including the surface of the field generating elements; and transferring energy from the plasma to a precursor material or materials and forming in the "active volume" at least one of nanoparticles and a vapor that may be condensed to form a nanoparticle.

A further object of the present invention is the production of stoichiometric-nanostructured materials with unique surface chemistry characterized by high aqueous dispersion stability, a low rate of hydrolysis, and a large zeta-potential.

These and other objects of the invention will become more apparent as the description thereof proceeds.

DESCRIPTION OF THE INVENTION

A free-burning electric arc is struck between anode and cathode using methods taught in U.S. Pat. Nos. 3,900,762, 3,899,573, and 4,080,550. Plasma generation is not limited to free-burning arcs, but may be selected from a group comprising radio-frequency fields, microwave discharges, free-burning electric arcs, transferred electric arcs, high-intensity lasers, capacitively coupled electro-thermal igniters, DC glow discharges, and DC cold cathode discharges.

Precursor materials are injected into the cathodic arc column by forced convection. Prior art teaches the injection velocity of the precursor materials, with respect to the cathodic arc column, must be controlled to enable the precursors to cross the arc column boundary to yield an efficient process. But precursors may also be aspirated into the arc from the surrounding atmosphere in the absence of forced convection. The object of this invention is not limited by the method or efficiency by which precursors are introduced into the plasma—only that the precursors are introduced into the plasma and energy is transferred from the plasma to the precursors. The form of the precursor does not limit the object of this invention; precursors are selected from a group comprising solids (powders, electrodes, etc.), liquids (atomized fluids, etc.) and gases or vapors.

The "active volume" is created through introduction of an oxidizing gas into the plasma, before the plasma is expanded into a field-free zone, either (1) in a region in close proximity to a zone of charge carrier generation, or (2) in a region of current conduction between field generating elements, including the surface of the field generation elements.

Energy is transferred from the plasma to a precursor material or materials and at least one of a stoichiometric-nanostructured material and a vapor that may be condensed to form a stoichiometric-nanostructured material is formed in the "active volume".

Injecting at least one of a quench and dilution stream just beyond the "active volume" enables additional control of the size of the stoichiometric-nanostructured material. The injection point beyond the "active volume" may vary from one mean free path of a plasma species (one collisional distance) to a larger distance deemed to be appropriate to quench the vapor and is generally determined by process equipment configuration.

The stoichiometric-nanostructured material may be collected by methods known to those familiar with the art.

EXAMPLE 1

Cerium Oxide—"Active Volume"

Two experiments utilizing nanostructured cerium oxide, synthesized with and without an "active volume" in the plasma, are presented.

The plasma was generated using a free-burning electric arc. The plasma gas was argon and the arc power was 62 kW.

The precursor material was particulate cerium oxide powder having an average particle size greater than 2 microns and 99.95% pure. The precursor was fluidized with a feed gas to create a heterogeneous precursor feed that was injected into cathodic arc column.

In Experiment 1 no "active volume" was created in the plasma. In Experiment 2 an "active volume" was created in the plasma by fluidizing the precursor with an oxidizing gas—oxygen—to form a heterogeneous precursor feed. In all other respects the two experiments were conducted under identical conditions.

Experiment 1 uses an inert gas to fluidize the precursor and is representative of prior teachings. In contrast, Experiment 2 creates an "active volume" in the plasma. Experiment 2 illustrates the teachings of this invention.

Both experiments yield nanostructured materials of similar particle sizes (approximately 95 nm) but have very different surface chemistry. The zeta potential for Experiment 1 and Experiment 2 material are 2.6 mV and 43.5 mV, respectively. Experiment 1 material does not form stable aqueous dispersions without the aid of dispersants.

The stoichiometicly-nanostructured material produced in Experiment 2 has a very high zeta potential, exhibits high dispersion stability without additives, and is hydrolytically stable. The stoichiometicly-nanostructure material produced in Experiment 2 has great value in polishing applications.

EXAMPLE 2

Cerium Oxide—"Active Volume" with Quench and Dilution

Two experiments utilizing nanostructured cerium oxide, synthesized with and without an "active volume" in the plasma followed by quenching and dilution, are presented.

The plasma was generated using a free-burning electric arc. The plasma gas was argon and the arc power was 62 kW.

The precursor material was particulate cerium oxide powder having an average particle size greater than 2 microns and 99.95% pure. The precursor was fluidized with a feed gas to create a heterogeneous precursor feed that was injected into cathodic arc column.

In Experiment 3 no "active volume" was created in the plasma. In Experiment 4 an "active volume" was created in the plasma by fluidizing the precursor with an oxidizing gas—oxygen—to form a heterogeneous precursor feed. A quench and dilution stream comprised of an oxidizing gas—oxygen—was injected just beyond the "active volume" in both experiments. In all other respects the two experiments were conducted under identical conditions.

Experiment 3 is representative of prior teaching and uses an inert gas to fluidize the precursor and an oxidizing gas to quench and dilute the product. In contrast, Experiment 4 creates an "active volume" in the plasma and quenches and dilutes the product. Experiment 4 illustrates the teachings of this invention.

Both experiments yield nanostructured materials of similar particle sizes (approximately 30 nm) but have very different surface chemistry. The zeta potential for Experiment 3 and Experiment 4 material are 10.9 mV and 39.4 mV, respectively. Experiment 3 material does not form stable aqueous dispersions without the aid of dispersants. Thus, the injection of an oxidizing gas just beyond the "active volume", as is shown in Experiment 3, is not sufficient to produce stoichiometicly-nanostructure materials with high zeta-potentials, hydrolytic stability, and the ability to form stable aqueous dispersions without additives.

The stoichiometicly-nanostructure material produced in Experiment 4 has a very high zeta potential, exhibits high dispersion stability without additives, and is hydrolytically stable. The stoichiometicly-nanostructure material produced in Experiment 4 has great value in polishing applications.

EXAMPLE 3

Extension of Process to Materials Other than Cerium Oxide

The methods taught in this patent may be extended to materials other than cerium oxide. For example, stable aqueous dispersions may be formed from the following materials listed with their zeta-potentials.

| Material | Zeta-Potential |
|---|---|
| Alumina | 46.5 mV |
| Antimony Tin Oxide | −49.9 mV |
| Indium Tin Oxide | 37.9 mV |

The preceding specific embodiments are illustrative of the practice of the invention. It is to be understood, however, that other expedients known to those skilled in the art, or disclosed herein, may be employed without departing from the spirit of the invention or the scope of the appended claims.

We claim:

1. Stoichiometric-nanostructured material produced through the steps comprising:
   generating a plasma;
   forming an "active volume" through introduction of an oxidizing gas into the plasma, before the plasma is expanded into a field free zone, in a region in close proximity to either (1) a zone of charge carrier generation, or (2) a region of current conduction between field generating elements, including the surface of the field generating electrodes; and
   transferring energy from the plasma to a precursor material or materials and forming in the "active volume" at least one of stoichiometric-nanostructured material and a vapor that may be condensed to form a stoichiometric-nanostructured material; wherein
   the stoichiometric-nanostructured material is cerium oxide and has a surface chemistry with the value of the zeta potential greater than 20 mV.

2. The stoichiometric-nanostructured material of claim 1, wherein the stoichiometric-nanostructured material is substantially spherical nanocrystalline cerium oxide.

3. The stoichiometric-nanostructured materials of claim 1, wherein the stoichiometric-nanostructured material generally has a size distribution and range in mean diameter from about 1 nm to about 900 nm.

4. The stoichiometric-nanostructured material of claim 3, wherein the stoichiometric-nanostructured material generally has a size distribution and range in mean diameter from about 2 nm to about 100 nm.

5. The stoichiometric-nanostructured material of claim 4, wherein the stoichiometric-nanostructured material generally has a size distribution and range in mean diameter from about 5 nm to about 40 nm.

6. The stoichiometric-nanostructured material of claim 1, wherein the stoichiometric-nanostructured material has a surface chemistry having a high aqueous dispersion stability.

7. The stoichiometric-nanostructured material of claim 1, wherein the stoichiometric-nanostructured material has a surface chemistry having a low rate of hydrolysis.

8. The stoichiometric-nanostructured material of claim 1, wherein the stoichiometric-nanostructured material has a surface chemistry with the value of the zeta potential greater than 30 mV.

9. The stoichiometric-nanostructured materials of claim 8, wherein the stoichiometric-nanostructured material has a surface chemistry with the value of the zeta potential greater than 35 mV.

* * * * *